(12) United States Patent
Kester et al.

(10) Patent No.: US 9,394,605 B1
(45) Date of Patent: Jul. 19, 2016

(54) VAPOR DEPOSITION SYSTEM AND METHOD

(71) Applicant: QUANTUM INNOVATIONS, INC., Central Point, OR (US)

(72) Inventors: Norman L. Kester, Central Point, OR (US); Cliff J. Leidecker, Rogue River, OR (US); John B. Glarum, Rogue River, OR (US)

(73) Assignee: QUANTUM INNOVATIONS, INC., Central Point, OR (US)

( * ) Notice: Subject to any disclaimer, the term of this patent is extended or adjusted under 35 U.S.C. 154(b) by 48 days.

(21) Appl. No.: 14/339,121

(22) Filed: Jul. 23, 2014

Related U.S. Application Data

(62) Division of application No. 13/030,091, filed on Feb. 17, 2011.

(60) Provisional application No. 61/343,672, filed on May 3, 2010, provisional application No. 61/343,669, filed on May 3, 2010, provisional application No. 61/338,949, filed on Feb. 26, 2010, provisional application No. 61/338,951, filed on Feb. 26, 2010, provisional application No. 61/343,668, filed on May 3, 2010.

(51) Int. Cl.
C23C 16/00 (2006.01)
C23C 14/56 (2006.01)
C23C 14/58 (2006.01)

(52) U.S. Cl.
CPC ........... *C23C 14/568* (2013.01); *C23C 14/5826* (2013.01)

(58) Field of Classification Search
CPC ................ C23C 16/45551; C23C 16/45548; C23C 16/45544
USPC ........................................................ 427/248.1
See application file for complete search history.

(56) References Cited

U.S. PATENT DOCUMENTS

| | | | |
|---|---|---|---|
| 4,008,683 A * | 2/1977 | Rose .................. | H01J 37/18 118/50.1 |
| 4,237,183 A | 12/1980 | Fujiwara et al. | |
| 4,485,759 A | 12/1984 | Brandolf | |
| 4,663,009 A * | 5/1987 | Bloomquist ............ | C23C 14/14 204/192.15 |
| 4,981,408 A * | 1/1991 | Hughes .................. | B23Q 7/003 118/719 |
| 5,026,469 A | 6/1991 | Kunkel et al. | |
| 5,370,737 A | 12/1994 | Mathis | |
| 6,090,444 A | 7/2000 | Wixon et al. | |
| 6,251,551 B1 * | 6/2001 | Kunze-Concewitz | H01L 21/67715 430/22 |
| 6,294,227 B1 | 9/2001 | Anma et al. | |
| 6,817,712 B2 | 11/2004 | Hayashi | |
| 7,014,664 B2 | 3/2006 | Inuzuka | |

(Continued)

FOREIGN PATENT DOCUMENTS

DE 19836652 2/2000

*Primary Examiner* — Kelly M Gambetta
(74) *Attorney, Agent, or Firm* — Jerry Haynes Law

(57) ABSTRACT

A deposition system includes a system housing having a housing interior, a fixture transfer assembly having a generally sloped fixture transfer rail extending through the housing interior, a plurality of processing chambers connected by the fixture transfer rail, a controller interfacing with the processing chambers and at least one fixture carrier assembly carried by the fixture transfer rail and adapted to contain at least one substrate. The fixture carrier assembly travels along the fixture transfer rail under influence of gravity. A deposition method is also disclosed.

18 Claims, 12 Drawing Sheets

(56) References Cited

U.S. PATENT DOCUMENTS

| | | |
|---|---|---|
| 2001/0015074 A1 | 8/2001 | Hosokawa |
| 2003/0190223 A1 | 10/2003 | Peiter |
| 2005/0019504 A1* | 1/2005 | Bi .................. C23C 16/401 427/596 |
| 2006/0049044 A1 | 3/2006 | Seddon |
| 2006/0102078 A1 | 5/2006 | Fairbairn et al. |
| 2007/0197681 A1 | 8/2007 | Lowery et al. |
| 2008/0220264 A1 | 9/2008 | Iyer et al. |
| 2009/0169766 A1 | 7/2009 | Takahashi et al. |
| 2009/0234450 A1 | 9/2009 | Lowery et al. |
| 2009/0320755 A1 | 12/2009 | Liu et al. |
| 2010/0040801 A1 | 2/2010 | Mitsuishi et al. |
| 2010/0102025 A1 | 4/2010 | Eagerton |
| 2010/0137984 A1 | 6/2010 | Lowery et al. |
| 2010/0162955 A1 | 7/2010 | Lei et al. |
| 2010/0313809 A1 | 12/2010 | Guo et al. |

* cited by examiner

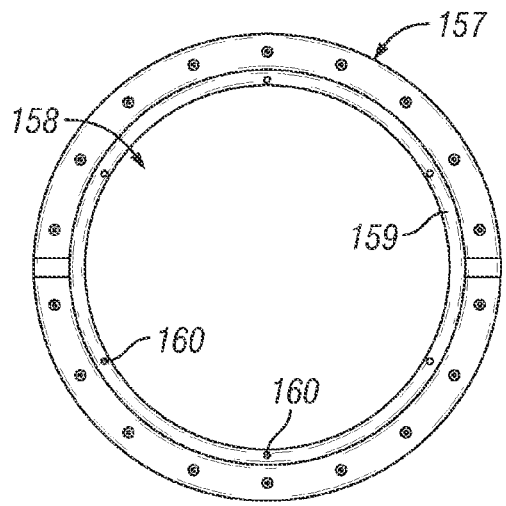
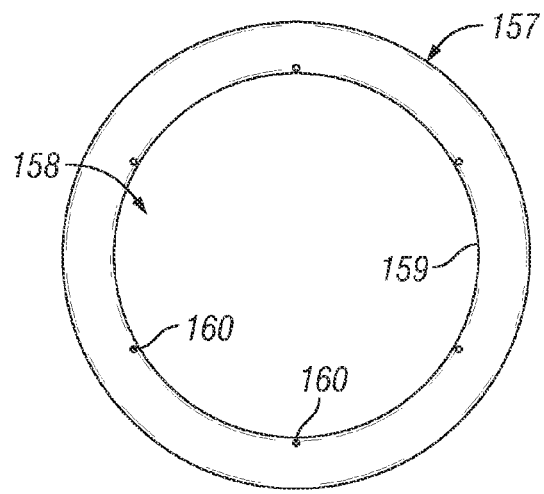
FIG. 13    FIG. 14
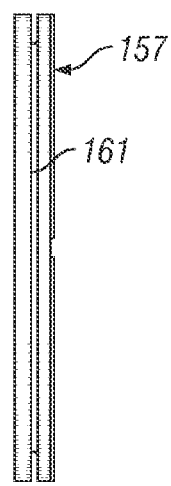
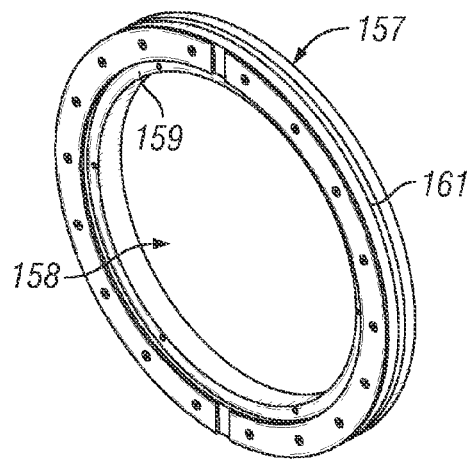
FIG. 15    FIG. 16

VAPOR DEPOSITION SYSTEM AND METHOD

CROSS-REFERENCE TO RELATED APPLICATIONS

This application is a divisional of U.S. application Ser. No. 13/030,091, filed Feb. 17, 2011 and entitled "VAPOR DEPOSITION SYSTEM AND METHOD", which claims the benefit of U.S. provisional application No. 61/338,949, filed Feb. 26, 2010 and entitled "FIXTURE TO SUSPEND OPTHALMIC LENSES FOR CONCAVE AND CONVEX SIDE APPLICATIONS; U.S. provisional application No. 61/338,951, filed Feb. 26, 2010 and entitled "FIXTURE DEVICE FOR THE APPLICATION OF VAPOR DEPOSITION ON THE CONCAVE AND CONVEX SIDES OF AN OPHTHALMIC LENS WHILE ROTATING"; U.S. provisional application No. 61/343,668, filed May 3, 2010 and entitled "GRAVITY FED TRANSFER MECHANISM"; U.S. provisional application No. 61/343,669, filed May 3, 2010 and entitled "HYDROPHOBIC, OLEOPHOBIC OR SUPER HYDROPHOBIC APPLICATOR"; and U.S. provisional application No. 61/343,672, filed May 3, 2010 and entitled "FULLY AUTOMATED, IN-LINE, HIGH THROUGHPUT, LOW VOLUME, SIMULTANEOUS AND NON-SIMULTANEOUS PROCESS, HIGH AND LOW VACUUM, PHYSICAL VAPOR DEPOSITION SYSTEM, each of which applications is incorporated by reference herein in its entirety.

FIELD OF THE INVENTION

The disclosure generally relates to coatings for optical lenses and other substrates. More particularly, the disclosure relates to a physical or chemical vapor, corona method, or thermal evaporation deposition system and method which facilitate sequential application of coatings to an optical lens or other substrate by gravity-actuated transfer of the substrates between successive deposition chambers.

BACKGROUND OF THE INVENTION

Optical lenses of eyewear such as eyeglasses and sunglasses may include one or more optical coatings which impart a desired appearance or optical characteristic to the lenses. An optical coating includes one or multiple layers of material which are deposited on one or both sides of an optical lens and affects the manner in which the lens reflects and transmits light. Antireflective coatings and high-reflective coatings are examples of optical coatings which may be applied to an optical lens.

A common method of applying an optical coating to an optical lens includes dipping the lens in a solution which adheres to one or both surfaces of the lens upon removal of the lens from the solution and then curing the solution to form the coating. Another method of applying an optical coating to an optical lens involves applying the coating to one or both surfaces of the lens using a physical vapor deposition (PVD) process.

In some applications, it may be necessary or desirable to sequentially apply multiple layered coatings to one or both surfaces of an optical lens. For example, application of optical coatings to one or both surfaces of optical lenses for eyewear may include application of metallic, dielectric, dichroic, hydrophobic, oleophobic or super hydrophobic coatings to the lenses in a sequential manner. One challenge, which is inherent in the serial application of coatings to optical lenses, is the transfer of each lens among multiple deposition chambers in a manner which is both efficient and does not risk physical contact or contamination of the freshly-applied coatings on the lens.

Therefore, a physical vapor deposition (PVD) system which facilitates sequential application of coatings to an optical lens or other substrate by gravity-actuated transfer of the substrates between successive PVD chambers is needed.

SUMMARY OF THE INVENTION

The disclosure is generally directed to a physical vapor deposition system. An illustrative embodiment of the system includes a system housing having a housing interior, a fixture transfer assembly having a generally sloped fixture transfer rail extending through the housing interior, a plurality of processing chambers connected by the fixture transfer rail, a controller interfacing with the processing chambers and at least one fixture carrier assembly carried by the fixture transfer rail and adapted to contain at least one substrate. The fixture carrier assembly travels along the fixture transfer rail under influence of gravity.

The disclosure is further generally directed to a physical vapor deposition method. An illustrative embodiment of the method includes providing a sloped gradient, providing a plurality of processing chambers along the sloped gradient, providing a fixture carrier assembly, placing substrates in the fixture carrier assembly and transporting the fixture carrier assemblies into and between the processing chambers along the sloped gradient under influence of gravity.

BRIEF DESCRIPTION OF THE DRAWINGS

The disclosure will now be made, by way of example, with reference to the accompanying drawings, in which:

FIG. 13 is a front view of an assembly frame of the exemplary fixture carrier assembly;

FIG. 14 is a rear view of the assembly frame;

FIG. 15 is a side view of the assembly frame;

FIG. 16 is a front perspective view of the assembly frame;

DETAILED DESCRIPTION

Figure 1:
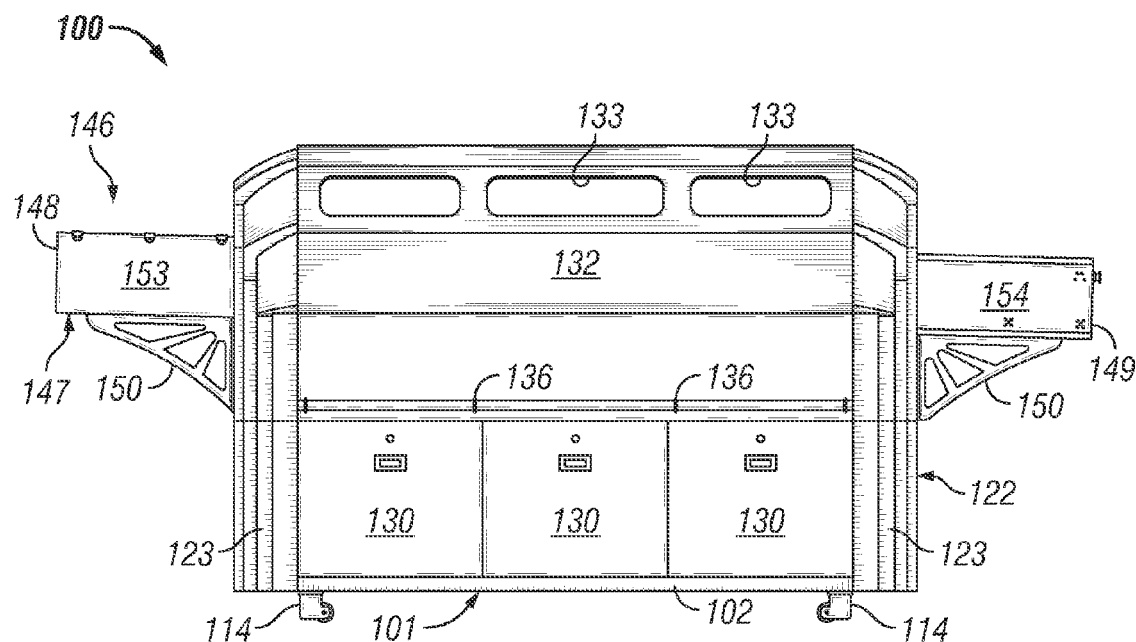
FIG. 1 is a front view of an illustrative embodiment of the physical vapor deposition system.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Referring initially to FIGS. 1-11 of the drawings, an illustrative embodiment of the physical vapor deposition system, hereinafter "system", is generally indicated by reference numeral 100. As will be hereinafter further described, the system 100 is adapted to sequentially apply one or more coatings (not illustrated) on one or both surfaces (not illustrated) of a substrate 182 (illustrated in phantom in FIG. 11) using a physical or chemical vapor, corona method or thermal evaporation deposition process. In some applications, the substrate 182 may be an optical lens of eyewear such as eyeglasses or sunglasses, for example and without limitation. The coating(s) which is/are applied to the substrate 182 may be metallic, dielectric, dichroic, hydrophobic, oleophobic or super hydrophobic coatings, for example and without limitation, which may serve as antireflective coatings, band pass filters, constructive filters, destructive filters, high-reflector coatings or other optical coatings known in the art. The processes which are used to apply the coatings to the substrate 182 may be sequentially carried out in a series of multiple chambers 185. Each substrate 182 may be transferred from one chamber 185 to the next chamber 185 in the deposition process via gravity, as will be hereinafter further described.

Figure 7:
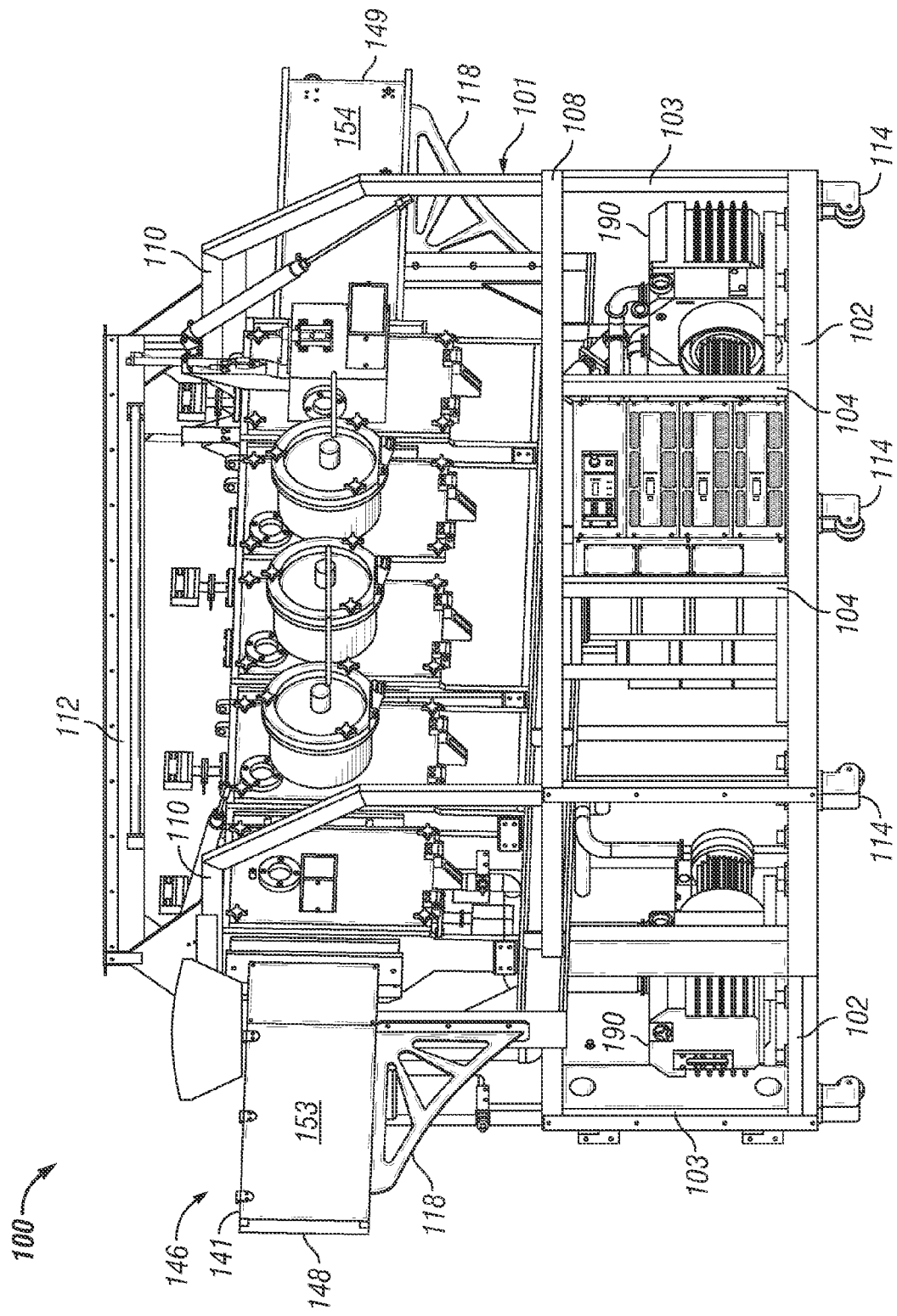
FIG. 7 is a perspective view of the illustrative physical vapor deposition system, more particularly illustrating an exemplary system frame and functional components of the system supported by the system frame.

The system 100 may include a system frame 101 which is adapted to support the various functional components of the system 100. As illustrated in FIG. 7, in some embodiments the system frame 101 may be generally elongated with a generally rectangular base frame portion 102. Multiple upright corner frame members 103 may extend from the respective corners of the base frame portion 102. Upright side frame members 104 may extend from the base frame portion 102 between the corner frame members 103.

A generally rectangular frame platform 108 may be supported by the corner frame members 103 and the side frame members 104. The corner frame members 103 may extend beyond the respective corners of the frame platform 108. Transverse frame members 110 may extend between the upper ends of the adjacent corner frame members 103 at each end of the system frame 101. A generally elongated top frame member 112 may extend between the transverse frame members 110. As illustrated in FIGS. 1-7, in some embodiments frame wheels 114 may be provided on the base frame portion 102 of the system frame 101 to render the system 100 portable. In other embodiments, the system frame 101 may be rendered immobile on a floor or other support surface (not illustrated). In alternative embodiments, the system frame 101 may have other shapes or designs which are consistent with the functional requirements of the system 100.

A system housing 122 may be provided on the system frame 101. In some embodiments, the system housing 122 may include a pair of side housing panels 123 provided at opposite ends of the system frame 101. The side housing panels 123 may be attached to the system frame 101 using fasteners (not illustrated) and/or alternative fastening techniques known by those skilled in the art.

Figure 6:
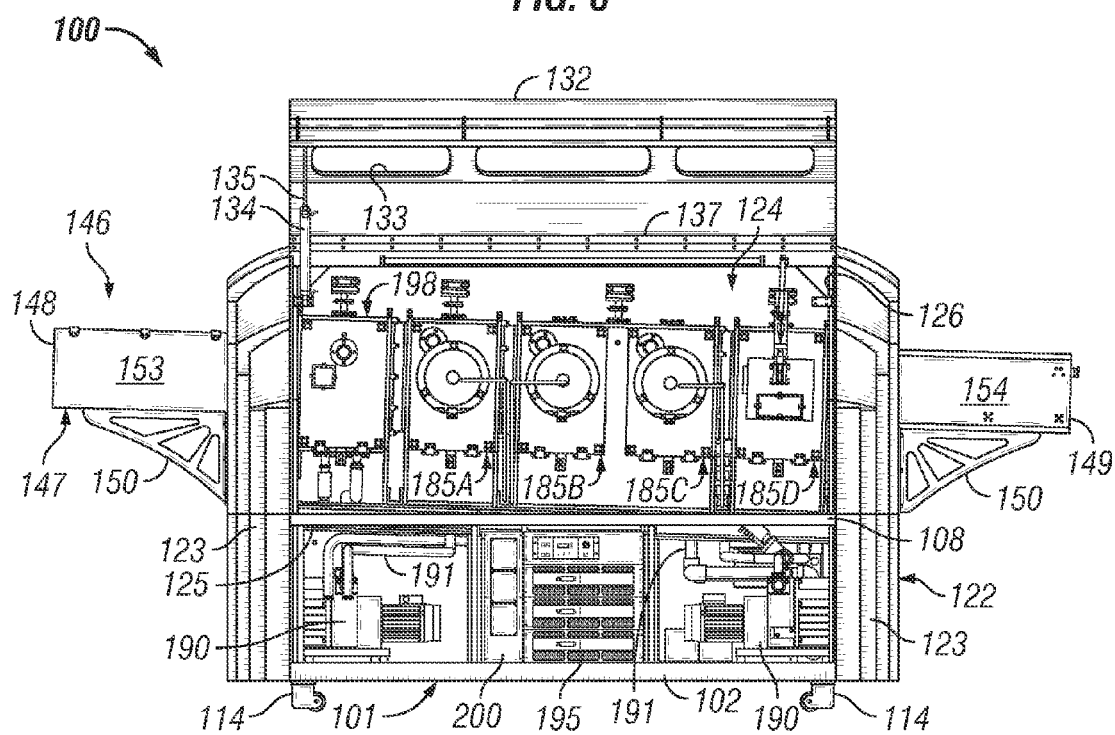
FIG. 6 is a front view of the illustrative physical vapor deposition system, with the front chamber compartment door and front subsystem compartment doors opened to expose a subsystem compartment.

As illustrated in FIG. 6, the system housing 122 may have a housing interior 124. The frame platform 108 of the system frame 101 may divide the housing interior 124 into a lower subsystem compartment 125 and an upper chamber compartment 126. The subsystem compartment 125 may contain various subsystem components of the system 100 which will be hereinafter described. The chamber compartment 126 may contain an etching chamber 198 as well as one or more of the PVD chambers 185 and other components of the system 100.

Figure 2:
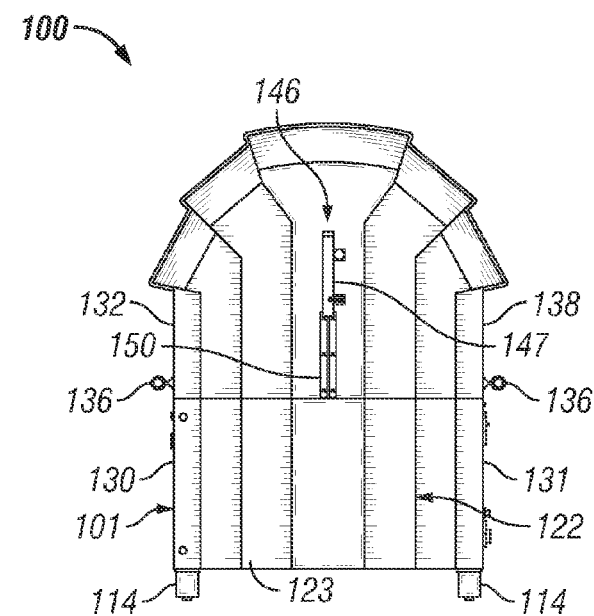
FIG. 2 is a side view of the illustrative physical vapor deposition system.
Figure 3:
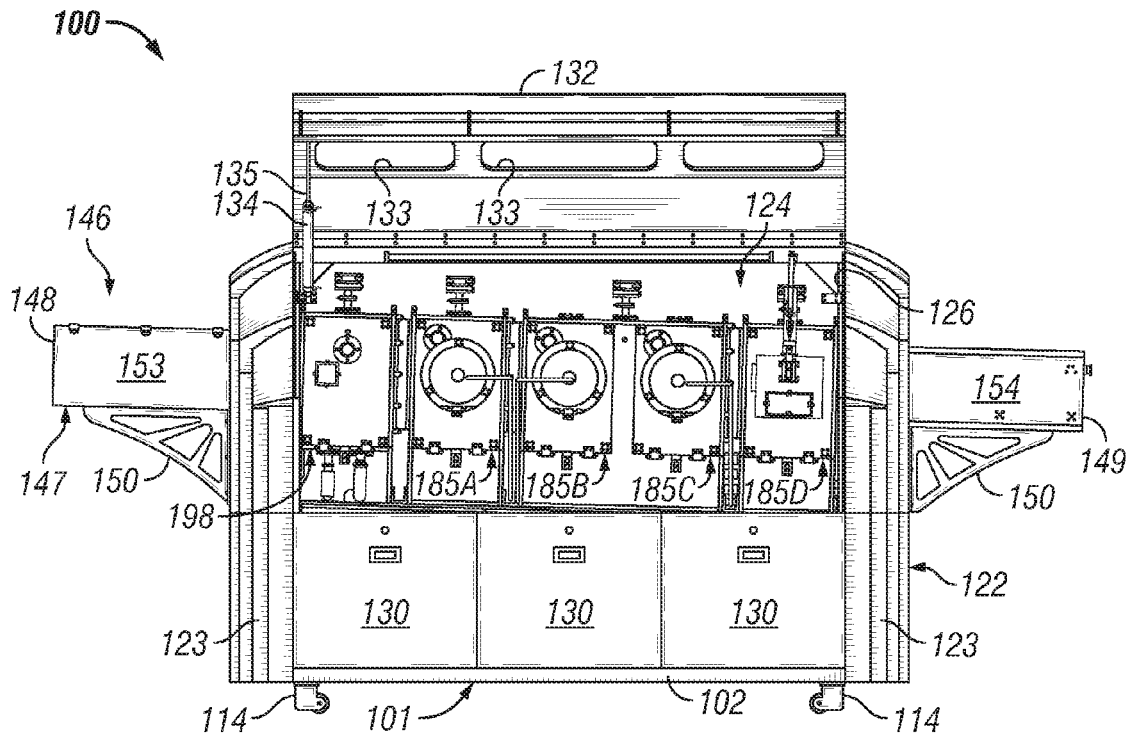
FIG. 3 is a front view of the illustrative physical vapor deposition system, with a front chamber compartment door opened to expose a chamber compartment.

As illustrated in FIGS. 1-4, the system housing 122 may include at least one front subsystem compartment door 130 provided on the system frame 101. In some embodiments multiple, adjacent front subsystem compartment doors 130 may be pivotally attached to the system frame 101. The front subsystem compartment doors 130 may be selectively opened to expose the subsystem compartment 125 at the front portion of the housing interior 124, as illustrated in FIG. 6, or selectively closed to conceal the subsystem compartment 125 at the front portion of the housing interior 124, as illustrated in FIGS. 1 and 3.

Figure 5:
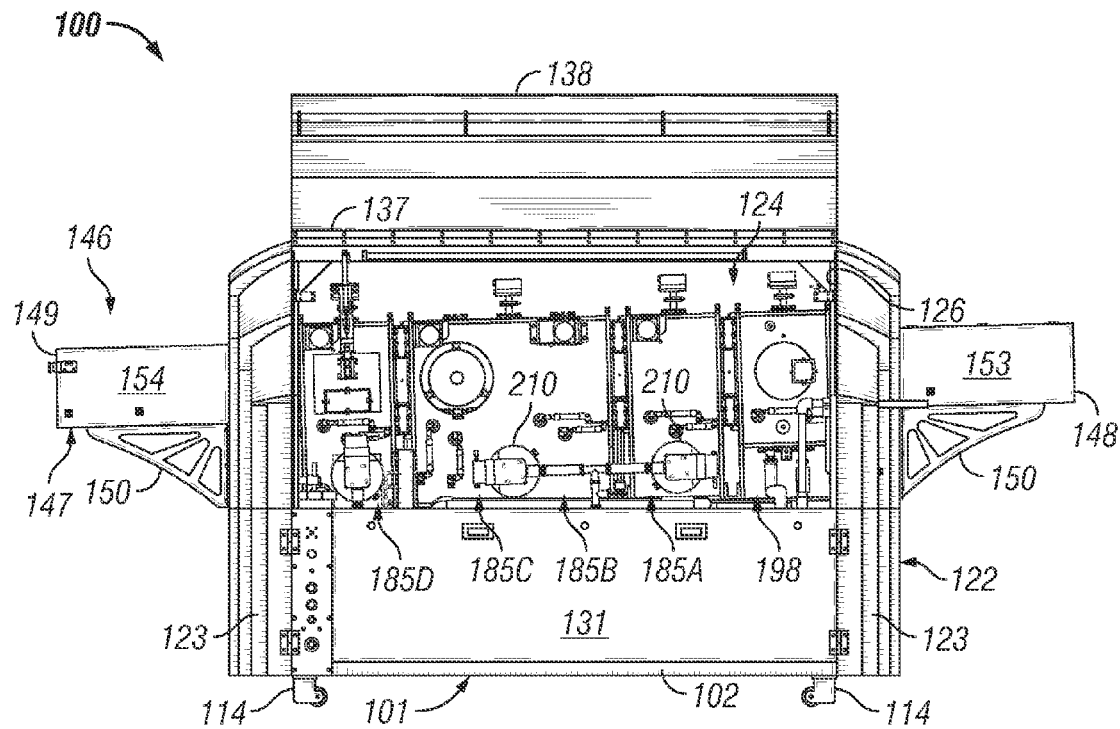
FIG. 5 is a rear view of the illustrative physical vapor deposition system, with the rear chamber compartment door opened to expose the chamber compartment.
Figure 8:
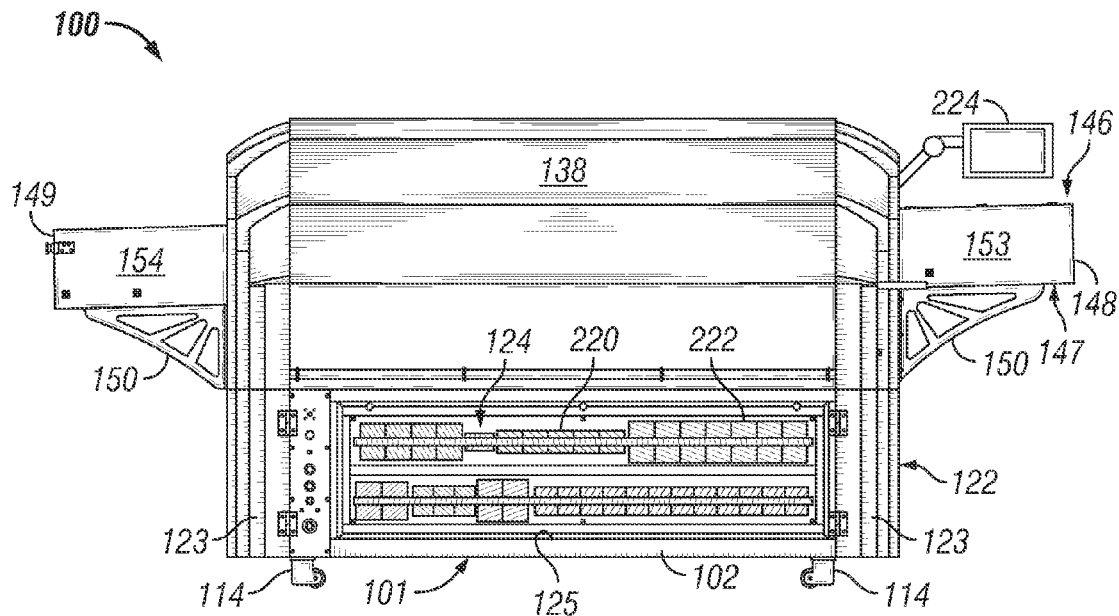
FIG. 8 is a rear view of the illustrative physical vapor deposition system, with the rear subsystem compartment door opened.

As illustrated in FIG. 5, the system housing 122 may further include at least one rear subsystem compartment door 131 provided on the system frame 101. The rear subsystem compartment door 131 may be selectively opened to expose the subsystem compartment 125 at the rear portion of the housing interior 124, as illustrated in FIG. 8, or selectively closed to conceal the subsystem compartment 125 at the rear portion of the housing interior 124, as illustrated in FIG. 5.

Figure 4:
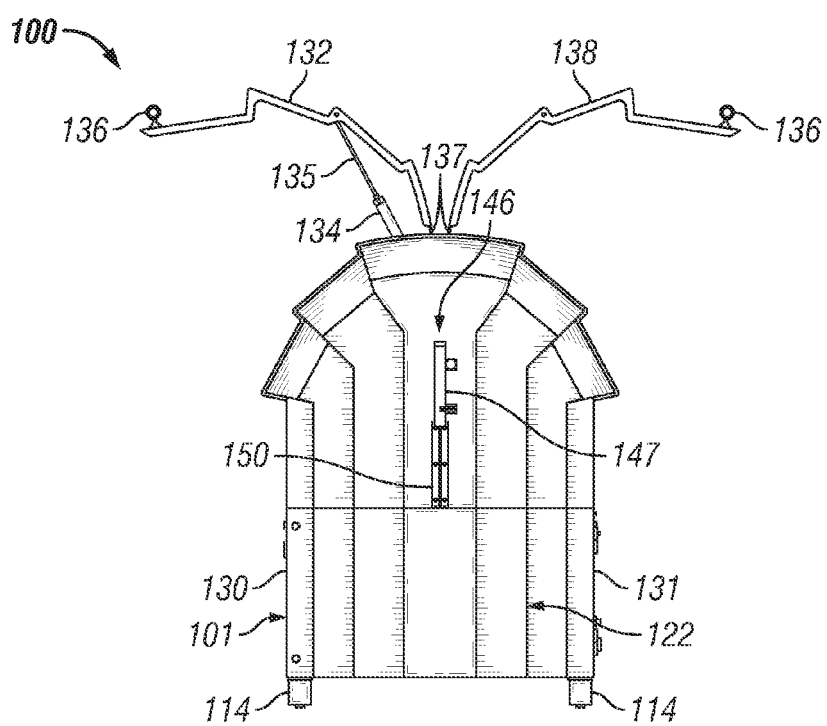
FIG. 4 is a side view of the illustrative physical vapor deposition system, with the front chamber compartment door and a rear chamber compartment door opened.

The system housing 122 may include a front chamber compartment door 132 provided on the system frame 101 to selectively expose and conceal the chamber compartment 126 at the front portion of the housing interior 124. The front chamber compartment door 132 may have multiple windows 133. In some embodiments, the front chamber compartment door 132 may be pivotally attached to the top frame member 112 (FIG. 7) and/or some other component of the system frame 101 via door hinges 137 (FIG. 4). At least one door handle 136 may be provided on the front chamber compartment door 132. The door handle 136 may be adapted to selectively lock the front chamber compartment door 132 in the closed position of FIGS. 1 and 2 or selectively unlock the front chamber compartment door 132 for opening as illustrated in FIGS. 3 and 4. As illustrated in FIGS. 3, 4 and 6, at least one door extension cylinder 134 may be attached to the system frame 101. A door extension piston 135 may be extendable from the door extension cylinder 134. The door extension piston 135 may be attached to an interior surface of the front chamber compartment door 132. Accordingly, when the front chamber compartment door 132 is closed, the door extension piston 135 is retracted into the door extension cylinder 134. When the front chamber compartment door 132 is open, the door extension piston 135 extends from the door extension cylinder 134 and maintains the front chamber compartment door 132 in the open position.

As illustrated in FIGS. 2, 4 and 5, the system housing 122 may further include a rear chamber compartment door 138 provided on the system frame 101 to selectively expose and conceal the chamber compartment 126 at the rear portion of the housing interior 124. The rear chamber compartment door 138 may have a design and attachment which are as were heretofore described with respect to the front chamber compartment door 132.

As further illustrated in FIGS. 1-9, the system 100 may include a fixture transfer assembly 146. The fixture transfer assembly 146 may include a generally elongated fixture transfer rail 147 which extends through the chamber compartment 126 of the housing interior 124 in the system housing 122. The fixture transfer rail 147 may have a fixture loading end 148 and a fixture unloading end 149. A loading ramp segment 153 and an unloading ramp segment 154 of the fixture transfer rail 147 may protrude beyond the respective loading and unloading ends, respectively, of the system housing 122. The fixture transfer rail 147 may generally slope downwardly from the fixture loading end 148 to the fixture unloading end 149.

Figure 9:
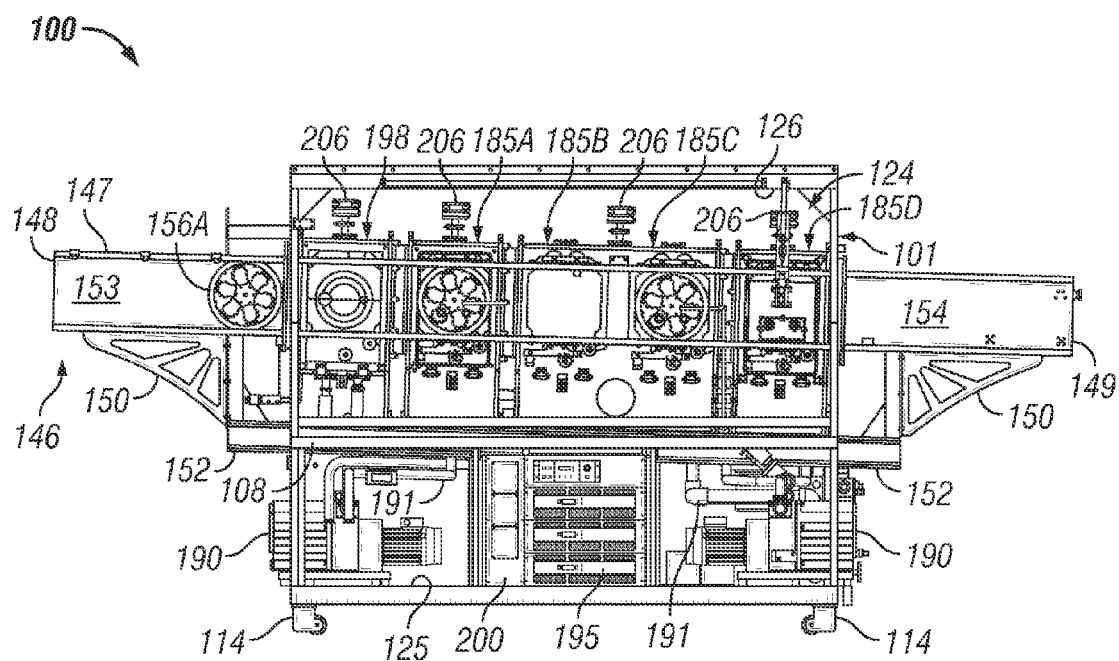
FIG. 9 is a front interior view of the chamber compartment and the subsystem compartment of the illustrative physical vapor deposition system.

The fixture transfer rail 147 of the fixture transfer assembly 146 may be mounted in the chamber compartment 126 of the housing interior 124 according to any suitable technique which is known by those skilled in the art. As illustrated in FIG. 9, in some embodiments, the fixture transfer assembly 146 may include a generally elongated chamber support member 152 which extends through the chamber compartment 126 in generally sloped relationship to the longitudinal axis of the system frame 101. The chamber support member 152 may be attached to the frame platform 108 and/or other structural component of the system frame 101 using welding, fasteners and/or other suitable attachment technique. A pair of rail support brackets 150 may attach the fixture transfer rail 147 to respective ends of the chamber support member 152. Accordingly, the fixture transfer rail 147 may be disposed above and in generally parallel, spaced-apart relationship with respect to the chamber support member 152. As illustrated in FIG. 1, the fixture transfer rail 147 may be sloped with respect to the horizontal at a slope angle 151. In some embodiments, the slope angle 151 may be about 91.50 degrees.

As illustrated in FIGS. 10-16, the fixture transfer assembly 146 (FIGS. 1-9) may further include at least one fixture carrier assembly 156. In some embodiments, the fixture transfer assembly 146 may include multiple fixture carrier assemblies 156. Each fixture carrier assembly 156 may include an annular assembly frame 157 having a frame opening 158 (FIGS. 13, 14 and 16). A circumferential frame flange 159 may extend into the frame opening 158. As illustrated in FIGS. 15 and 16, a circumferential rail groove 161 may be provided in the outer surface of the assembly frame 157 for purposes which will be hereinafter described.

Figure 10:
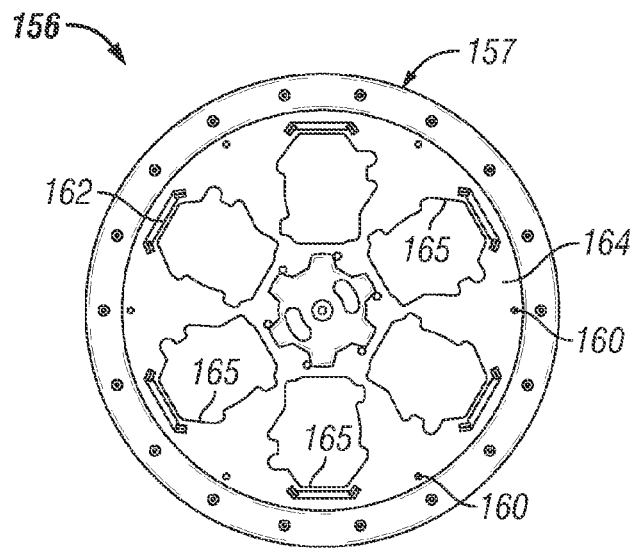
FIG. 10 is a front view of an exemplary fixture carrier assembly which is suitable for implementation of the illustrative physical vapor deposition system.

As illustrated in FIG. 10, a generally circular fixture mount plate 164 may be mounted in the frame opening 158 of the assembly frame 157. In some embodiments, the fixture mount plate 164 may be attached to the frame flange 159 (FIG. 13) using fasteners 160. In other embodiments, the fixture mount plate 164 may be fabricated in one piece with the assembly frame 157. As further illustrated in FIG. 10, multiple fixture openings 165 may be provided in the fixture mount plate 164 for purposes which will be hereinafter described. As illustrated in FIG. 10, a fixture clamp 162 may be provided on the fixture mount plate 164 adjacent to each fixture opening 165 for purposes which will be hereinafter described.

A substrate fixture 170 (FIGS. 11 and 12) may be mounted in each fixture opening 165 in the fixture mount plate 164. In some embodiments, each substrate fixture 170 may be secured in each corresponding fixture opening 165 by engagement of the corresponding fixture clamp 162 with the substrate fixture 170. Each substrate fixture 170 may include a fixture frame 171 which may be generally elongated and has a fixture frame opening 172. A generally elongated lens support arm 173 may be pivotally attached to the fixture frame 171 via a support arm pivot pin 174. The lens support arm 173 can be selectively pivoted with respect to the support arm pivot pin 174 into and out of the fixture frame opening 172. A substrate contact blade 178 may be pivotally mounted with respect to the lens support arm 173 via a contact blade pivot pin 179. Multiple additional substrate contact blades 178 may be pivotally attached to the fixture frame 171 via respective contact blade pivot pins 179. The substrate contact blades 178 can be selectively pivoted with respect to the contact blade pivot pins 179 at a selected angle in the fixture frame opening 172. Accordingly, the lens support arm 173 and the substrate contact blades 178 can be selectively individually pivoted to extend into the fixture frame opening 172 of the fixture frame 171 to contact the substrate edge 183 of a substrate 182 and hold the substrate 182 in the fixture frame opening 172 without contacting either surface of the substrate 182.

Referring next to FIGS. 3, 5, 6 and 9 of the drawings, an etching chamber 198 and at least one PVD chamber 185 may be supported by the sloped fixture transfer rail 147 of the fixture transfer assembly 146 in the chamber compartment 126 of the housing interior 124. In some embodiments, the etching chamber 198 may be provided on the fixture transfer rail 147 with a first PVD chamber 185a, a second PVD chamber 185b, a third PVD chamber 185c, and a fourth PVD chamber 185d. The etching chamber 198 may be disposed closest to the fixture loading end 148 of the fixture transfer rail 147. The fourth PVD chamber 185d may be disposed closest to the fixture unloading end 149 of the fixture transfer rail 147. The first PVD chamber 185a, the second PVD chamber 185b and the third PVD chamber 185c may be sequentially ordered between the etching chamber 198 and the fourth PVD chamber 185d. Therefore, the etching chamber 198 and each of the PVD chambers 185 may assume the sloped or angled orientation of the fixture transfer rail 147.

Figure 17:
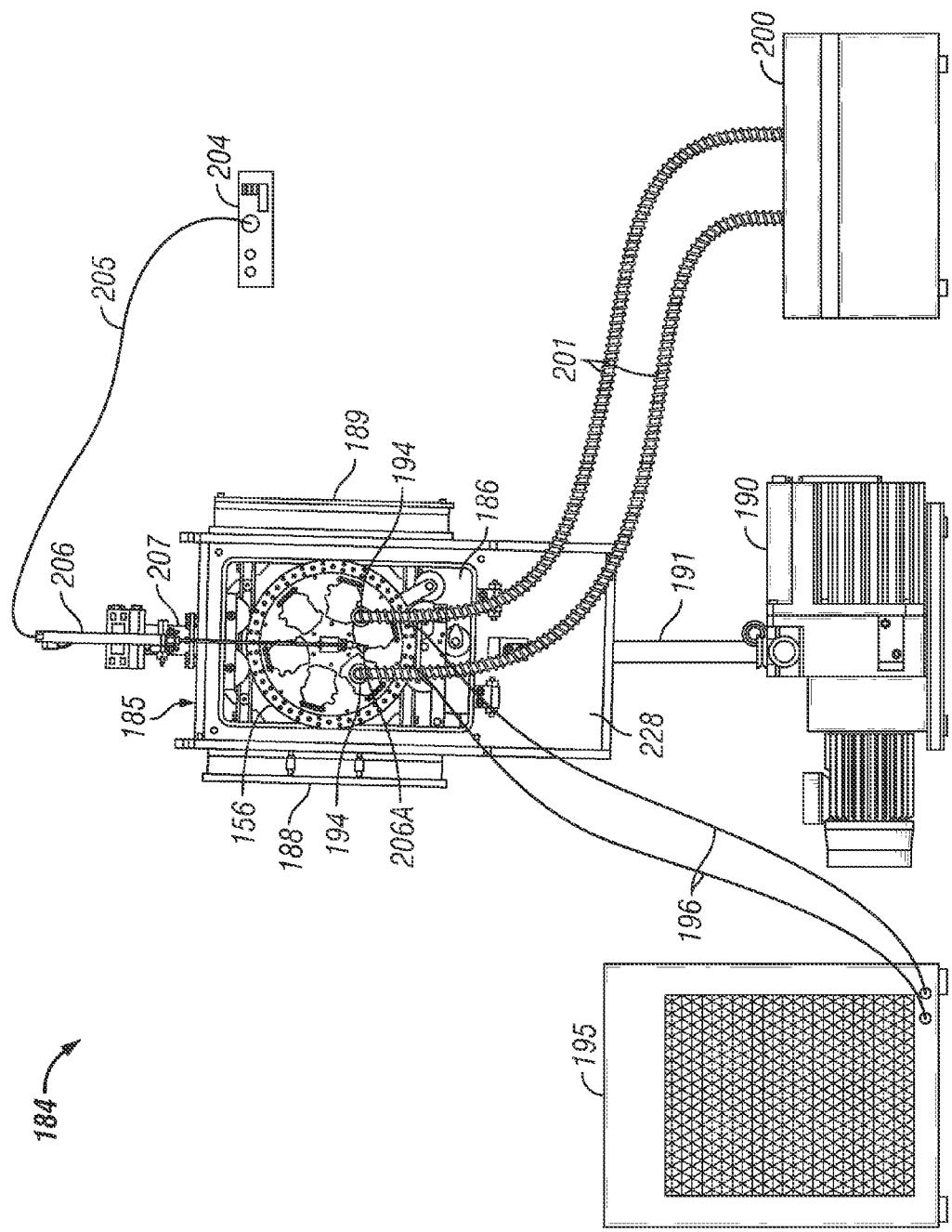
FIG. 17 is a front view of a film applicator which is suitable for implementation of an illustrative embodiment of the physical vapor deposition system, further illustrating an interior view of the physical vapor deposition chamber and a fixture carrier assembly functionally deployed in the chamber.

Referring next to FIGS. 17-21 of the drawings, each PVD chamber 185 may have a PVD chamber interior 186 (FIG. 17). The PVD chamber interior 186 of each PVD chamber 185 may be adapted to receive and contain a fixture carrier assembly 156 in application of the system 100, which will be hereinafter described. A fixture entry valve 188 may be disposed in fluid communication with the PVD chamber interior 186 at an inlet side of the PVD chamber 185. A fixture outlet valve 189 may be disposed in fluid communication with the PVD chamber interior 186 at an outlet side of the PVD chamber 185. The fixture entry valves 188 and the fixture outlet valves 189 may couple the first PVD chamber 185a to the etching chamber 198 and the PVD chambers 185a-185d to each other with a vacuum-tight seal in the chamber compartment 126 of the housing interior 124. In operation of the system 100, which will be hereinafter further described, the fixture entry valve 188 and the fixture outlet valve 189 may facilitate sequential transfer of each of multiple fixture carrier assemblies 156 into and out of, respectively, the PVD chamber interior 186 of each PVD chamber 185.

As further illustrated in FIG. 17, each PVD chamber 185 may be part of a film applicator system 184. The film applicator system 184 may include a roughing pump 190 which is disposed in fluid communication with the PVD chamber interior 186 of the PVD chamber 185 through a roughing pump conduit 191. Water-cooled evaporation sources 194 may be provided in the PVD chamber interior 186 of the PVD chamber 185. A water chiller 195 may be connected to the water-cooled evaporation sources 194 through a pair of water hoses 196. An evaporation power supply 200 may be electrically connected to the water-cooled evaporation sources 194 through a pair of power cables 201.

Figure 19:
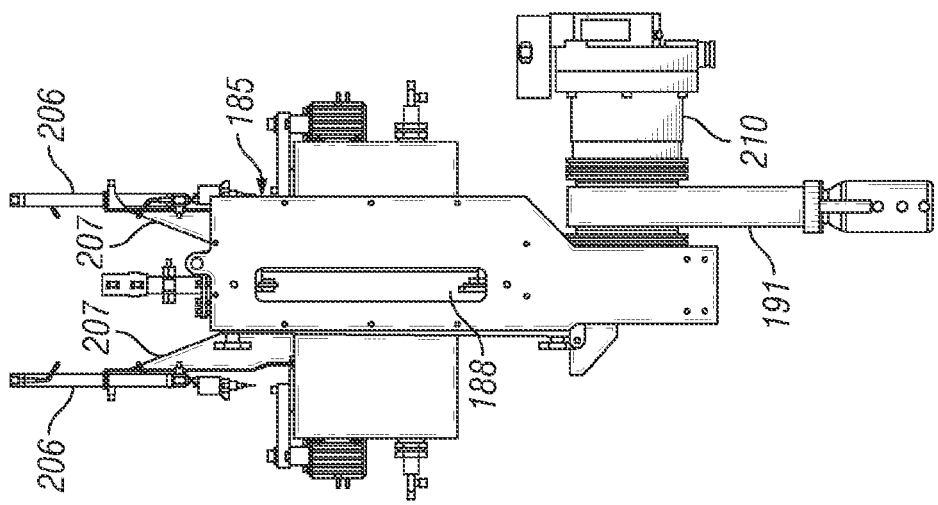
FIG. 19 is a side view of the exemplary physical vapor deposition chamber.
Figure 18:
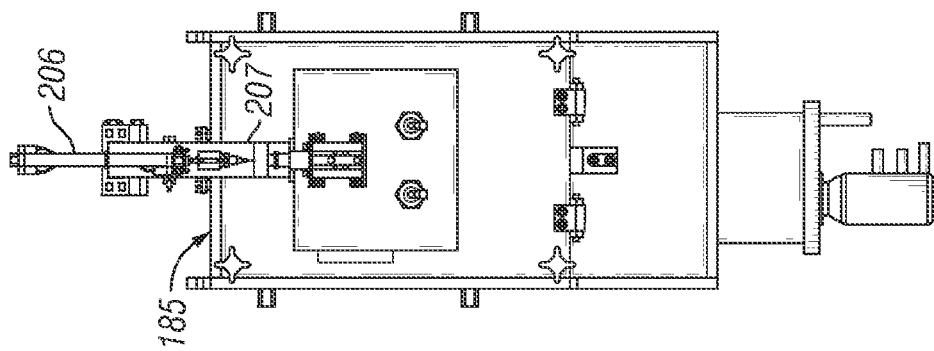
FIG. 18 is a front view of an exemplary physical vapor deposition chamber of the film applicator.

At least one liquid delivery injection arm 206 may be disposed in fluid communication with the PVD chamber interior 186 of the PVD chamber 185. As illustrated in FIG. 19, in some embodiments, a pair of front and rear liquid delivery injection arms 206 may be disposed in fluid communication with the PVD chamber interior 186. An arm internalization mechanism 207 may engage each liquid delivery injection arm 206 for internalization of the liquid delivery injection arms 206 through respective front and back side liquid delivery ports (not illustrated) into the PVD chamber interior 186 in operation of the system 100. When in the internalized configuration, the liquid delivery injection arms 206 may be positioned on opposite front and back sides of the fixture carrier assembly 156. A deposition liquid delivery system 204 may be disposed in fluid communication with the liquid delivery injector arms 206 through liquid delivery lines 205.

Figure 21:
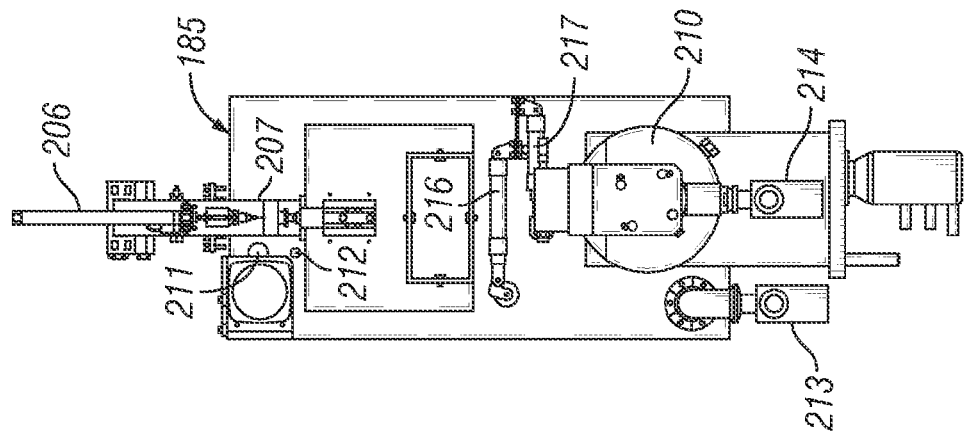
FIG. 21 is a rear view of the exemplary physical vapor deposition chamber, with external components attached to the chamber.
Figure 20:
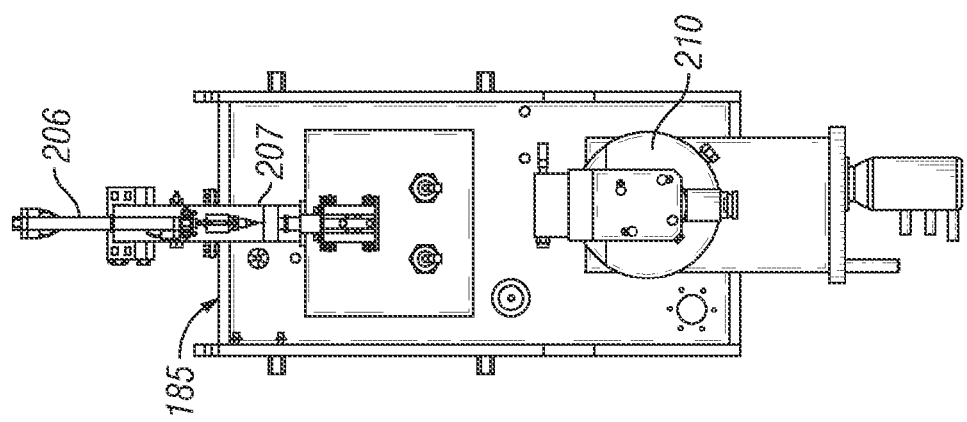
FIG. 20 is a rear view of the exemplary physical vapor deposition chamber.

As illustrated in FIGS. 20 and 21, a turbomolecular pump 210 may be disposed in fluid communication with the PVD chamber interior 186 (FIG. 17) of the PVD chamber 185. As illustrated in FIG. 21, the PVD chamber 185 may include a fixture rotation mechanism 211 which facilitates rotation of the fixture carrier assembly 156 (FIG. 17) in the PVD chamber interior 186 of the PVD chamber 185. The fixture rotation mechanism 211 may include a movement sensor 212 which senses movement of the fixture carrier assembly 156 in the PVD chamber interior 186. As further illustrated in FIG. 21, a vacuum valve 213 may be disposed in fluid communication with the PVD chamber interior 186 of the PVD chamber 185. A vacuum valve 214 may communicate with the turbomolecular pump 210.

It will be recognized and understood that the foregoing description of each PVD chamber 185 is a general description and it will be recognized and understood that PVD chambers of various design which are known by those skilled in the art may be suitable for the purpose of depositing coatings on substrates 182 (FIG. 11) using physical vapor deposition techniques in operation of the system 100. Some PVD chambers 185 which are suitable for implementation of the system 100 may depart in at least some design details from the foregoing description of the PVD chamber 185 which was set forth herein above with respect to FIGS. 17-21. Moreover, the etching chamber 198 (FIG. 9) may have any etching chamber design with necessary hardware which is suitable for etching and cleaning of the substrates 182 preparatory to deposition of coatings on the substrates 182 by operation of the PVD chambers 185. Etching chamber designs are well-known by those skilled in the art; therefore, the hardware and design of the etching chamber 198 need not be set forth herein in detail. Generally, the etching chamber 198 may include a fixture entry valve 188 and a fixture outlet valve 189 which facilitate entry and exit of individual fixture carrier assemblies 156 into and out of, respectively, the etching chamber 198, as was heretofore described with respect to the PVD chamber 195 in FIG. 17.

Figure 22:
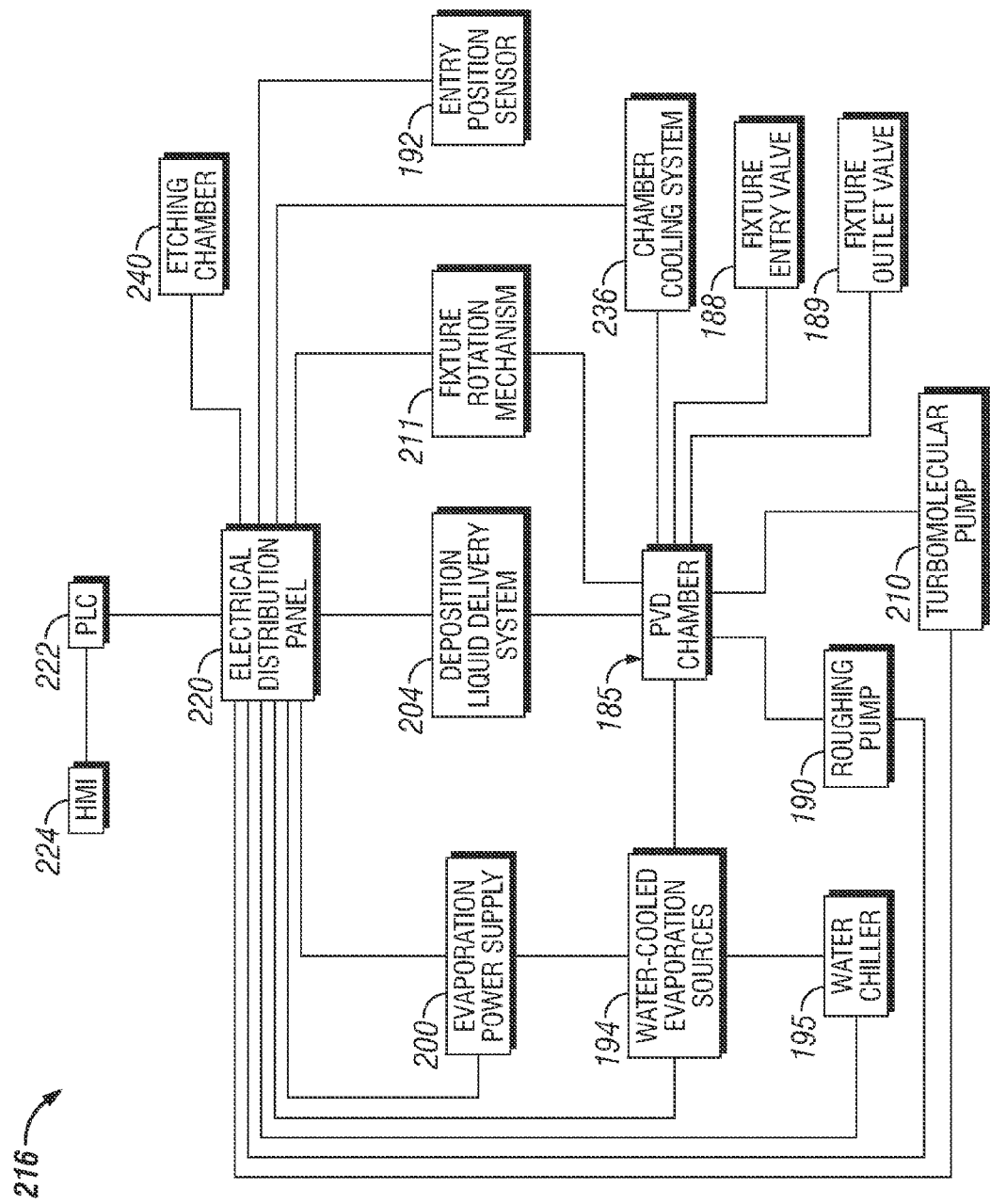
FIG. 22 is a block diagram which illustrates interconnection of the various subsystem components of the physical vapor deposition system.

Referring next to FIG. 22 of the drawings, a block diagram of a control system 216 which is suitable for implementation of the physical vapor deposition system 100 is illustrated. The control system 216 may include a programmable logic controller (PLC) 222. A human-machine interface (HMI) 224 may interface with the PLC 222. The HMI 224 may include a keyboard, mouse and/or other elements which may be used to program the PLC 222 to operate the multiple functions of the system 100. An electrical distribution panel 220 may interface with the PLC 222. The various functional components of the system 100 may be electrically connected to the electrical distribution panel 220. Accordingly, the PLC 222 may be adapted to operate the various subsystems of the system 200 through the electrical distribution panel 220.

Some of the subsystems of the system 100 may include the roughing pump 190, the water-cooled evaporation sources 194, the deposition liquid delivery system 204, the fixture rotation mechanism 211, the fixture entry valve 188, the fixture outlet valve 189 and the turbomolecular pump 210, each of which was heretofore described with respect to FIGS. 17-21 and each of which also is disposed inside or interfaces with the PVD chamber 185. The evaporation power supply 200 may be electrically connected to the electrical distribution panel 220 and the water-cooled evaporation sources 194 in the PVD chamber 185. The water chiller 195 may be electrically connected to the electrical distribution panel 220 and disposed in fluid communication with the water-cooled evaporation sources 194. In some embodiments, an entry position sensor 192 may be connected to the electrical distribution panel 220 and disposed at the entry position of the PVD chamber 185 adjacent to the fixture entry valve 188. The entry position sensor 192 may be adapted to sense the fixture carrier assembly 156 at the entry position of the PVD chamber 185 and enable the PLC 222 to open the fixture entry valve 188 of the PVD chamber 185 for entry of the fixture carrier assembly 156 into the PVD chamber 185, as will be hereinafter described. The etching chamber 198 may also be electrically connected to the electrical distribution panel 220 for control by the PLC via the HMI 224. As further illustrated in FIG. 22, in some embodiments, a chamber cooling system 236 may interface with the PVD chamber 185 and the electrical distribution panel 220 for the purpose of cooling the PVD chamber interior 186 (FIG. 17) of the PVD chamber 185.

Some of the subsystems of the system 100 may be contained in the subsystem compartment 125 of the housing interior 124. As illustrated in FIGS. 6 and 9, in some embodiments, the roughing pumps 190, the water chiller 195 and the evaporation power supply 200 may be contained in the subsystem compartment 125 in the front portion of the housing interior 124. As illustrated in FIG. 8, the electrical distribution panel 220 and the PLC 222 may be contained in the subsystem compartment 125 in the rear portion of the housing interior 124. The subsystems can be selectively exposed and accessed for repair, replacement and/or maintenance purposes by opening the front subsystem compartment doors 130 (FIG. 1) and the rear subsystem compartment door 131 (FIG. 5). Likewise, the etching chamber 198 and the PVD chambers 185 can be selectively exposed and accessed for repair, replacement and/or maintenance purposes by opening the front chamber compartment door 132 and the rear chamber compartment door 138.

Referring next to FIGS. 9-12 of the drawings, in exemplary application, the system 100 is operated to apply one or multiple coatings (not illustrated) to one or both sides of a substrate 182 (FIG. 11) in a sequential manner using a physical vapor deposition (PVD) process. In some applications, the substrate 182 may be an optical lens which will be used in the assembly of eyewear such as eyeglasses or sunglasses, for example and without limitation. For example and without limitation, in some applications, the system 100 may be operated to plasma etch the front and backsides of an optic lens; apply a mirror coating to the front of the lens; and apply an oleophobic/hydrophobic coating to the front and backside of the lens. In other applications, the substrate 182 may be any type of substrate to which one or more coatings is to be applied using a PVD process.

Figure 11:
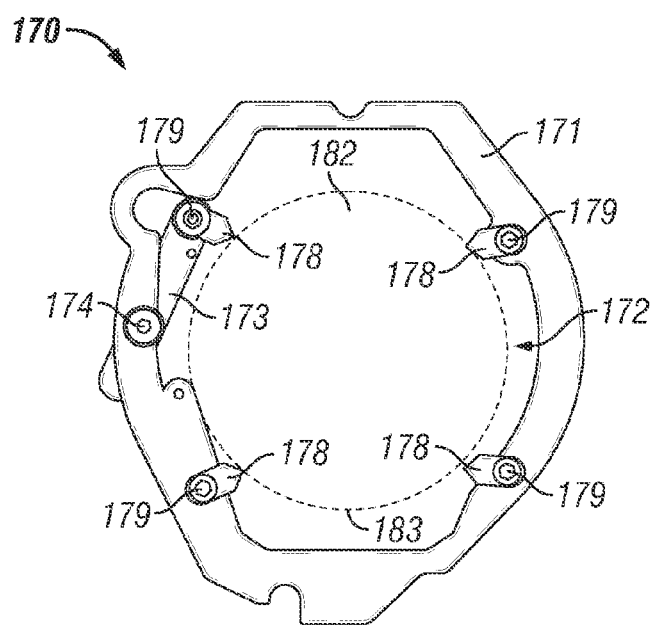
FIG. 11 is a front view of an exemplary lens fixture of the fixture carrier assembly.
Figure 12:
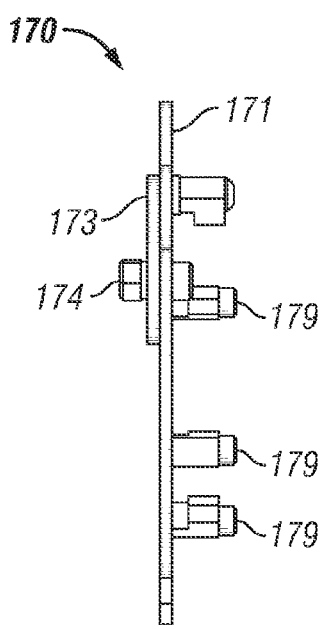
FIG. 12 is a top view of the exemplary lens fixture.

Multiple substrates 182 (FIG. 11) are secured in each of multiple fixture carrier assemblies 156 (FIG. 10). As will be hereinafter further described, each fixture carrier assembly 156 serves as a vehicle for transport of the substrates 182 between and within the etching chamber 198 and the sequential PVD chambers 185. Accordingly, as illustrated in FIG. 11, each substrate 182 may initially be secured in the fixture frame opening 172 of a corresponding substrate fixture 170. The angular positions of the substrate contact blades 178 in the fixture frame opening 172 are adjusted such that the substrate contact blades 178 contact the substrate edge 183 of the substrate 182 and hold the substrate 182 in the fixture frame opening 172 in a "floating" manner. The angle of the lens support arm 173 may also be adjusted with respect to the fixture frame 171 via the support arm pivot pin 174 as deemed necessary to ensure an optimum fit of the substrate 182 within the orbit defined by the substrate contact blades 178. Multiple substrate fixtures 170 are then secured in the respective fixture openings 165 (FIG. 10) in the fixture mount plate 164 of each fixture carrier assembly 156. In some embodiments, the substrate fixtures 170 may be secured in the respective fixture openings 165 using the fixture clamps 162 (FIG. 10) as was heretofore described. In alternative embodiments, the substrate fixtures 170 may be secured in the respective fixture openings 165 using alternative mechanisms known by those skilled in the art.

As illustrated in FIG. 9, at least one fixture carrier assembly 156 (each containing multiple substrate fixtures 170 with a substrate 182 held therein) is initially placed on the loading ramp segment 153 of the fixture transfer rail 147. In some embodiments, multiple fixture carrier assemblies 156 may be placed in series on the loading ramp segment 153 of the fixture transfer rail 147. Each fixture carrier assembly 156 may be lowered in place on the loading ramp segment 153 such that the circumferential rail-groove 161 (FIGS. 15 and 16) in the assembly frame 157 of the fixture carrier assembly 156 receives the loading ramp segment 153 of the fixture transfer rail 147. Therefore, each fixture carrier assembly 156 is self-standing on the loading ramp segment 153.

Due to the angled or sloped configuration of the loading ramp segment 153, each fixture carrier assembly 156 has a tendency to roll under influence of gravity on the fixture transfer rail 147 from the first fixture loading end 148 toward the fixture unloading end 149 thereof. Accordingly, the fixture carrier assembly 156a (FIG. 8) which is first in the series of multiple fixture carrier assemblies 156 on the loading ramp segment 153 rolls to a "ready" position adjacent to a fixture entry valve (not illustrated) at the inlet of the etching chamber 198. The next fixture carrier assembly 156 rolls into the space which was previously occupied by the first fixture carrier assembly 156a, and the remaining fixture carrier assemblies 156 roll into the spaces previously occupied by the preceding fixture carrier assemblies 156, respectively.

The system 100 is initialized and enters a standby condition as the PLC 222 is turned on. The operational parameters (temperature, pressure, etc.) for the etching process which is to be carried out in the etching chamber 198 and for each of the deposition processes which are to be sequentially carried out in the PVD chambers 185 may be programmed into the PLC 222 (FIG. 22) through the HMI 224. An entry position sensor (not illustrated) at the "ready" position adjacent to the fixture entry valve (not illustrated) of the etching chamber 198 senses the location of the first fixture carrier assembly 156a at the "ready" position and transmits a signal to the PLC 222. In response, the PLC 222 opens the fixture entry valve of the etching chamber 198 and the first fixture carrier assembly 156a rolls into the etching chamber 198. Simultaneously, the front and back side liquid delivery ports (not illustrated) of the last PVD chamber 185d are opened and the front and rear liquid delivery injector arms 206, under actuation by the arm internalization mechanisms 207 (FIG. 17), descend into the last PVD chamber 185d. The PLC 222 then closes the fixture entry valve of the etching chamber 198 and establishes the programmed pressure in the etching chamber 198. The next fixture carrier assembly 156 in line on the loading ramp segment 153 rolls on the fixture transfer rail 147 under the influence of gravity into the "ready" position next to the fixture entry valve of the etching chamber 198.

After the PLC 222 establishes the etching pressure and other operational parameters which were preprogrammed into the PLC 222, the etching chamber 198, under control by the PLC 222, etches and cleans both surfaces of each substrate 182 which is held in the first fixture carrier assembly 156a. After etching and cleaning of the substrates 182 in the first fixture carrier assembly 156a is completed, the PLC 222 opens a fixture outlet valve (not illustrated) of the etching chamber 198 and the first fixture carrier assembly 156a rolls from the etching chamber 198 into the entry position of the first PVD chamber 185a. The entry position sensor 192 (FIG. 22) senses that the first fixture carrier assembly 156a is at the entry position of the first PVD chamber 185a and transmits a signal to the PLC 222 indicating the entry position of the first fixture carrier assembly 156a. The first fixture carrier assembly 156a rolls into place in the PVD chamber interior 186 of the first PVD chamber 185a. The PLC 222 then closes the fixture entry valve 188. The PLC 222, responsive to input from the entry sensor (not illustrated) at the "ready" position of the etching chamber 198, vents the etching chamber 198 to atmosphere, opens the fixture entry valve (not illustrated) of the etching chamber 198 and the fixture carrier assembly 156 which was next in line behind the first fixture carrier assembly 156a rolls on the fixture transfer rail 147 into the etching chamber 198. The PLC 222 establishes the etching pressure and other operational parameters which were preprogrammed into the PLC 222, the etching chamber 198, under control by the PLC 222, etches and cleans both surfaces of each substrate 182 which is held in the first fixture carrier assembly 156a.

Simultaneously, after a predetermined period of time has elapsed to ensure thorough coating of the substrates 182, the PLC 222 then opens the fixture outlet valve 189 of the first PVD chamber 185a such that the first fixture carrier assembly 156a rolls under influence of gravity from the chamber interior 186 of the first PVD chamber 185a to the fixture entry position of the second PVD chamber 185b. The PLC 222 then closes the fixture outlet valve 189 of the first PVD chamber 185a and vents the etching chamber 198. The same PVD and transfer process is then carried out on the substrates 182 of the first fixture carrier assembly 156a in the second PVD chamber 185b, the third PVD chamber 185c and the fourth PVD chamber 185d until the desired coatings have been sequentially applied to the surfaces of each substrate 182. The fixture rotation mechanism 211 (FIG. 21) may rotate the fixture carrier assembly 156a in any chamber interior 186 as programmed in the PLC 222. As the PVD process is carried out in the first PVD chamber 185a, the substrates 182 held in the fixture carrier assembly 156 which was next in line behind the first fixture carrier assembly 156a are etched in the etching chamber 198. The substrates 182 in that next-in-line fixture carrier assembly 156 are then subjected to the PVD processes in the first PVD chamber 185a, the second PVD chamber 185b, the third PVD chamber 185c and the fourth PVD chamber 185d in the same manner as the substrates 182 in the first fixture carrier assembly 156a.

The deposition liquid (not illustrated) which will form the coatings on one or both surfaces of each substrate 182 in the first fixture carrier assembly 156a is dispensed from the deposition liquid delivery system 204 (FIG. 17) through the respective liquid delivery lines 205 to the liquid delivery injector arms 206. The liquid delivery injector arms 206 dispense the deposition liquid into the water-cooled evaporation sources 206A (FIG. 17) in the chamber interior 186. Once the deposition liquid is fully dispensed into the evaporation sources 194, the liquid delivery injector arms 206 are retracted from the chamber interior 186 and the liquid delivery ports (not illustrated) are closed. Next, the fixture rotation mechanism 211 (FIG. 21) may rotate the first fixture carrier assembly 156a in the chamber interior 186 and the PLC 222 pulls vacuum on the last PVD chamber 185d via the roughing pump 190 and the turbomolecular pump 210. Once the correct level of vacuum pressure in the PVD chamber interior 186 has been achieved, the deposition liquid in the evaporation sources 194 is evaporated into the chamber interior 186, coating the substrates 182 in the first fixture carrier assembly 156a After the PVD processes in the fourth PVD chamber 185d are completed, the fixture carrier assemblies 156 sequentially roll from the fourth PVD chamber 185d onto the unloading ramp segment 154 of the fixture transfer rail 147. The fixture carrier assemblies 156 are removed from the unloading ramp segment 154 and the substrate fixtures 170 (FIG. 11) are removed from the respective fixture openings 165 in the fixture carrier assembly 156. Finally, the substrates 182 may be removed from the substrate fixtures 170 for further processing. During use of the system 100, the PLC 222 operates the chamber cooling system 236 (FIG. 22) to regulate the PVD chamber interior 186 (FIG. 17) and operating systems of each PVD chamber 185 as deemed necessary.

It will be appreciated by those skilled in the art that the physical vapor deposition system 100 is capable of processing substrates 182 in multiple fixture carrier assemblies 156 at the same time by simultaneous operation of the etching chamber 198 and the PVD chambers 185. This expediently facilitates high-speed, low-volume and high-throughput production of thin film-coated substrates using physical vapor deposition processes. Moreover, transfer of the fixture carrier assemblies 156 between the etching chamber 198 and the successive fixture carrier assemblies 156 by gravity eliminates the need for mechanical structure and related power supply which would otherwise be required for the transfer operation. The system 100 may be designed such that the chamber functions and capabilities are flexible and can be adapted for various types of physical or chemical vapor, corona or thermal deposition applications on different types of substrates. Examples include but are not limited to ophthalmic mirror coatings, ophthalmic antireflective coatings, protective coatings, cosmetic coatings, compact disc manufacturing electronic wafer manufacturing and medical device manufacturing. The construction methods and materials for the system 100 may be tailored according to the particular thin or thick films which are to be applied to the substrates 182. The system 100 may be constructed in any of various sizes depending on the desired application. Various alternative designs for the subsystems, assemblies and components may be used in various embodiments of the system 100. The system 100 may be fabricated using a variety of fabrication techniques including but not limited to welding, brazing, connectors, terminal blocks, screws, bolts, nuts and clamps.

Various structural provisions instead of or in addition to those which were heretofore described with respect to the drawings may be made for the functioning and distribution of the vacuum subsystem, pneumatic subsystem, electrical subsystem and/or any other subsystems or components which may be deemed necessary for operation of the etching chamber 198, the PVD chambers 185 or any other operational component or subsystem of the system 100. For example and without limitation, as illustrated in FIG. 6, vacuum system conduits 240 may be routed throughout the housing interior 124 to provide connection between the roughing pumps 190, turbomolecular pumps 210 and/or other pumps and the etching chamber 198 or the PVD chambers 185. As illustrated in FIG. 5, pneumatic system conduits 242 may provide connection between vacuum subsystem components or pneumatic subsystem components and the etching chamber 198 or PVD chambers 185. Pneumatic system ports 244 (FIG. 5) may be provided in the fixture transfer rail 147 and/or other structural components of the system 100 for functioning of the pneumatic subsystem. Other structural provisions may include whichever supports, wiring and plumbing may be necessary to interconnect all components and subsystems.

The film applicator system 184 (FIG. 17) of the system 100 may be designed as a stand-alone unit, as part of an in-line deposition system or as part of a larger, more complex system. The film applicator system 184 can coat one side or two sides of a substrate 182 and a two-sided coating applied to the substrate 182 may be performed individually or simultaneously at high speeds and high throughput. The film applicator system 184 may be operated manually, semi-automatically or fully automatically via a computer or the PLC 222 and HMI 224 (FIG. 22).

The substrate fixtures 170 (FIG. 11) are configured to hold the substrates 182 in such a manner that each substrate 182 is suspended in space and each substrate 182 can be coated evenly across the surface without hindrance. Each substrate fixture 170 may function as a flexible platform to hold various lenses and other substrates 182 in different configurations to ensure that the substrates 182 may be coated from both sides simultaneously. The substrate fixtures 170 and the fixture carrier assemblies 156 may be constructed of various materials depending on the particular application. The substrate fixtures 170 and the fixture carrier assemblies 156 may be constructed for single-side application and may be fabricated in various sizes. Alternative methods of holding the substrate 182 in the fixture frame opening 172 of each substrate fixture 170 may be used. Moreover, the design of each fixture carrier assembly 156 and each substrate fixture 170, as well as each PVD chamber 185 as described and illustrated herein, may facilitate uniform coating of either or both surfaces of each substrate 182 depending on the desired application.

Figure 23:
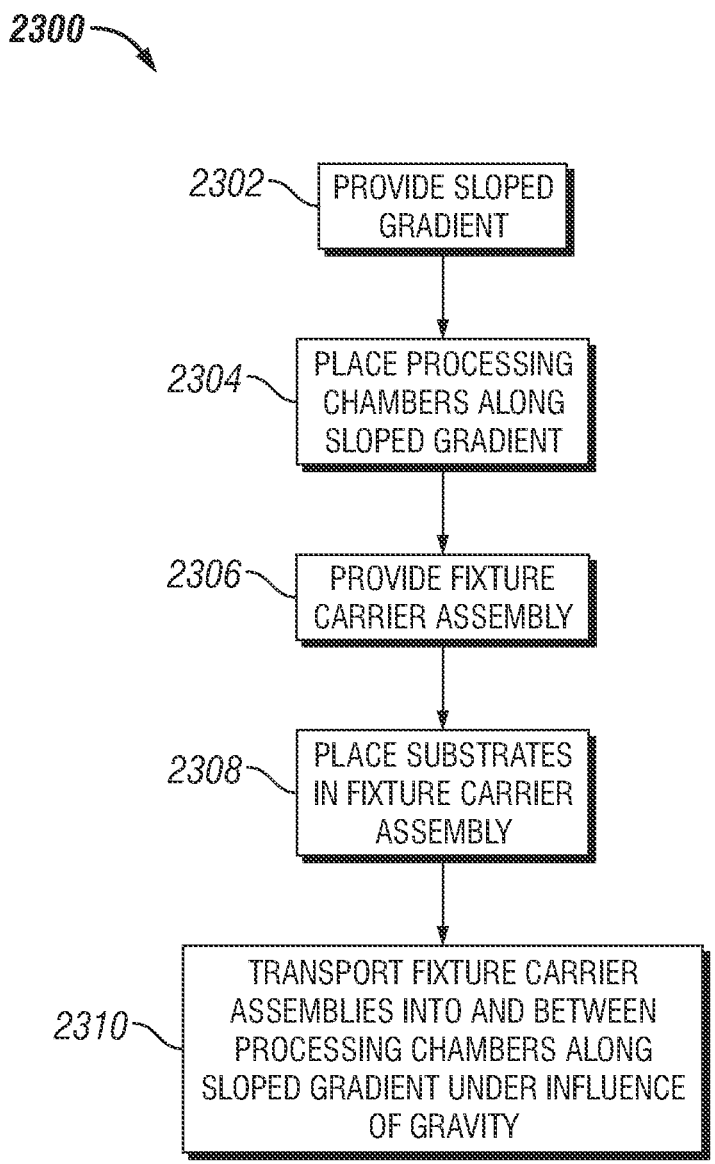
FIG. 23 is a flow diagram of an illustrative embodiment of a physical vapor deposition method.

Referring next to FIG. 23 of the drawings, a flow diagram 2300 of an illustrative embodiment of a physical vapor deposition method is illustrated. In block 2302, a sloped gradient is provided. In block 2304, processing chambers are placed along the sloped gradient. In some applications, the processing chambers may include an etching chamber and at least one physical vapor deposition (PVD) chamber. In some embodiments, the processing chambers may include an etching chamber and multiple sequentially-ordered PVD chambers. In block 2306, at least one fixture carrier assembly is provided. In block 2308, substrates are placed in the fixture carrier assembly. In block 2310, the fixture carrier assemblies are transported into and between the processing chambers along the sloped gradient under the influence of gravity. The design of each PVD chamber and each fixture carrier assembly may facilitate uniform or non-uniform deposition of one or more coatings on either or both surfaces of each substrate.

While various illustrative embodiments of the disclosure have been described above, it will be recognized and understood that various modifications can be made in the disclosure and the appended claims are intended to cover all such modifications which may fall within the spirit and scope of the embodiments of the disclosure.

What is claimed is:

1. A deposition method, comprising:
   providing a sloped gradient;
   providing a plurality of processing chambers along the sloped gradient;
   providing at least one fixture carrier assembly, the fixture carrier assembly having an annular assembly frame having a frame opening, a fixture mount plate in the frame opening, at least one fixture opening in the fixture mount plate, at least one substrate fixture in the at least one fixture opening and the at least one substrate fixture having a plurality of pivoting substrate contact blades;
   placing at least one substrate in the fixture carrier assembly;
   pivoting the plurality of pivoting substrate contact blades into contact with a substrate edge of the at least one substrate, the substrate contact blades limited to contact of the substrate at the substrate edge; and
   processing the substrates by transporting the fixture carrier assembly into and between the processing chambers along the sloped gradient under influence of gravity.

2. The deposition method of claim 1 wherein providing a plurality of processing chambers along the sloped gradient comprises providing at least one deposition chamber along the sloped gradient.

3. The deposition method of claim 2 wherein providing at least one deposition chamber along the sloped gradient comprises providing a plurality of sequentially-ordered deposition chambers along the sloped gradient.

4. The deposition method of claim 3 wherein providing a plurality of sequentially-ordered deposition chambers along the sloped gradient comprises providing a plurality of sequentially-ordered physical vapor deposition chambers along the sloped gradient.

5. The deposition method of claim 3 wherein providing a plurality of processing chambers along the sloped gradient comprises providing at least one etching chamber along the sloped gradient.

6. The deposition method of claim 1 wherein providing at least one substrate in the fixture carrier assembly comprises providing at least one optical lens in the fixture carrier assembly.

7. The deposition method of claim 1 wherein transporting the fixture carrier assembly comprises providing a generally elongated, sloping fixture transfer rail and transporting the fixture carrier assembly on the fixture transfer rail.

8. A deposition method, comprising:
   providing a sloped gradient;
   providing a plurality of processing chambers along the sloped gradient;
   providing a plurality of fixture carrier assemblies, each of the fixture carrier assemblies having an annular assembly frame with a frame opening, a fixture mount plate in the frame opening, a plurality of fixture openings in the fixture mount plate, a plurality of substrate fixtures in the plurality of fixture openings, respectively, and each of the substrate fixtures having a plurality of pivoting substrate contact blades;
   placing and securing a substrate in each of the substrate fixtures by engagement of the substrate contact blades with a substrate edge of the substrate, the substrate contact blades limited to contact of the substrate at the substrate edge; and
   processing the substrates by sequentially transporting the fixture carrier assemblies into and between the processing chambers along the sloped gradient under influence of gravity.

9. The deposition method of claim 8 wherein providing a plurality of processing chambers along the sloped gradient comprises providing at least one deposition chamber along the sloped gradient.

10. The deposition method of claim 9 wherein providing at least one deposition chamber along the sloped gradient comprises providing a plurality of sequentially-ordered deposition chambers along the sloped gradient.

11. The deposition method of claim 10 wherein providing a plurality of sequentially-ordered deposition chambers along the sloped gradient comprises providing a plurality of sequentially-ordered physical vapor deposition chambers along the sloped gradient.

12. The deposition method of claim 10 wherein providing a plurality of processing chambers along the sloped gradient comprises providing at least one etching chamber along the sloped gradient.

13. The deposition method of claim 8 wherein providing at least one substrate in the fixture carrier assembly comprises providing at least one optical lens in the fixture carrier assembly.

14. The deposition method of claim 8 wherein transporting the fixture carrier assembly comprises providing a generally elongated, sloping fixture transfer rail and transporting the fixture carrier assembly on the fixture transfer rail.

15. A deposition method, comprising:
   providing a sloped gradient including a generally elongated, sloping fixture transfer rail;
   providing an etching chamber and a plurality of sequentially-ordered deposition chambers along the fixture transfer rail;
   providing a plurality of fixture carrier assemblies, each of the fixture carrier assemblies including:
      a circular assembly frame having a frame opening;
      a circumferential rail groove in the assembly frame, the rail groove interfacing with the fixture transfer rail;
      a fixture mount plate in the frame opening;
      a plurality of fixture openings in the fixture mount plate;

a plurality of substrate fixtures each having a fixture frame in the plurality of fixture openings, respectively; and a plurality of pivoting substrate contact blades carried by the fixture frame;

placing and securing a substrate in each of the substrate fixtures by engagement of the substrate contact blades with a substrate edge of the substrate, the substrate contact blades limited to contact of the substrate at the substrate edge; and processing the substrates by sequentially transporting the fixture carrier assemblies into and between the processing chambers along the sloped gradient under influence of gravity by rolling the fixture carrier assemblies along the fixture transfer rail.

16. The deposition method of claim 15 wherein providing at least one substrate in the fixture carrier assembly comprises providing at least one optical lens in the fixture carrier assembly.

17. The deposition method of claim 16 wherein processing the substrates comprises plasma etching a front and a backside of the optical lens; applying a mirror coating to the front of the optical lens; and applying an oleophobic/hydrophobic coating to the front and the backside of the optical lens.

18. The deposition method of claim 15 wherein providing an etching chamber and a plurality of sequentially-ordered deposition chambers along the fixture transfer rail comprises providing an etching chamber and a plurality of sequentially-ordered physical deposition chambers along the fixture transfer rail.

* * * * *